(12) United States Patent
Jain et al.

(10) Patent No.: US 8,759,885 B1
(45) Date of Patent: Jun. 24, 2014

(54) STANDARD CELL FOR SEMICONDUCTOR DEVICE

(71) Applicants: Ankit Jain, Modinagar (IN); Vikas Tripathi, Kanpur (IN)

(72) Inventors: Ankit Jain, Modinagar (IN); Vikas Tripathi, Kanpur (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/873,217

(22) Filed: Apr. 30, 2013

(51) Int. Cl.
*H01L 27/10* (2006.01)
*H01L 27/118* (2006.01)
*H01L 27/092* (2006.01)

(52) U.S. Cl.
CPC ........ *H01L 27/11807* (2013.01); *H01L 27/092* (2013.01)
USPC ........... 257/204; 257/206; 716/118; 716/132; 716/135

(58) Field of Classification Search
CPC .................. H01L 27/0207; H01L 27/11807
USPC .................. 257/204, 206; 716/118, 132, 135
See application file for complete search history.

(56) References Cited

U.S. PATENT DOCUMENTS

| | | | |
|---|---|---|---|
| 5,847,421 A * | 12/1998 | Yamaguchi | 257/207 |
| 7,808,051 B2 | 10/2010 | Hou et al. | |
| 7,897,479 B2 | 3/2011 | Lin et al. | |
| 7,919,792 B2 | 4/2011 | Law et al. | |
| 7,958,465 B2 | 6/2011 | Lu et al. | |
| 2009/0007043 A1 | 1/2009 | Lin et al. | |
| 2011/0031536 A1 | 2/2011 | Okamoto et al. | |

* cited by examiner

*Primary Examiner* — Tu-Tu Ho
(74) *Attorney, Agent, or Firm* — Charles Bergere

(57) ABSTRACT

A standard cell for a semiconductor device has first and second opposing boundaries and third and fourth opposite boundaries, and includes first and second active regions formed in a semiconductor substrate. The first and second active regions are a first predetermined distance (a) from the first and second boundaries, respectively. A gate electrode is formed over the first and second active regions. First and second dummy diffusions layers are formed along the third boundary and are the first predetermined distance (a) from the first and second boundaries and a second predetermined distance (b) from the first and second active regions, respectively. Third and fourth dummy diffusions layers are formed along the fourth boundary and are the first predetermined distance (a) from the first and second boundaries and a third predetermined distance (b') from the first and second active regions, respectively.

19 Claims, 5 Drawing Sheets

FIG. 2B -Prior-Art-

FIG. 2A -Prior-Art-

STANDARD CELL FOR SEMICONDUCTOR DEVICE

BACKGROUND OF THE INVENTION

The present invention relates to semiconductor devices, and more particularly, to a standard cell used in a semiconductor device.

System level designers often integrate different logic functions into an integrated circuit (IC) using commercially available design tools including electronic design automation (EDA) and computer aided design (CAD) tools. Examples of ICs include microprocessors, microcontroller units (MCUs), systems-on-chips (SoCs), and application specific integrated circuits (ASICs). The logic functions are realized in the IC using standard cell methodology. A standard cell includes a plurality of transistors, viz., complementary metal-oxide semiconductor (CMOS) devices that are used to implement logic functions. The logic functions may include Boolean functions (e.g., AND, OR, and NOT), storage functions (e.g., flip-flops, latches, and buffers), and digital combinational functions (e.g., multiplexers and demultiplexers).

Each standard cell has a predetermined geometry (width and height). The EDA and CAD design tools include a library (known as a standard cell library) that stores the standard cell definitions for these logic functions. During semiconductor device design, the design tool selects one or more standard cells from the cell library based on the logic design and the process parameters (i.e., size and width of the standard cell) and places the cells in rows and columns. Upon completing the placement, the semiconductor device design is simulated, verified, and subsequently transferred to a chip (i.e., formed in Silicon).

Figure 1A:
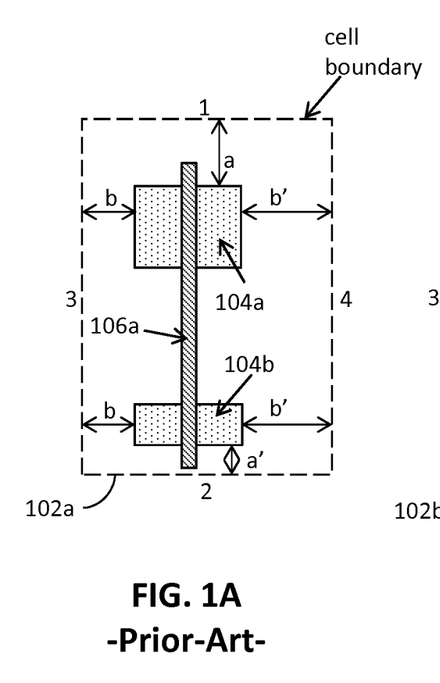
FIGS. 1A, 1B and 1C are schematic layout diagrams of conventional standard cells.
Figure 1B:
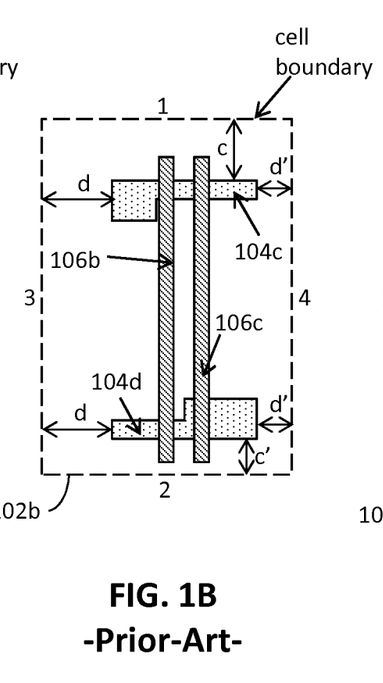
Figure 1C:
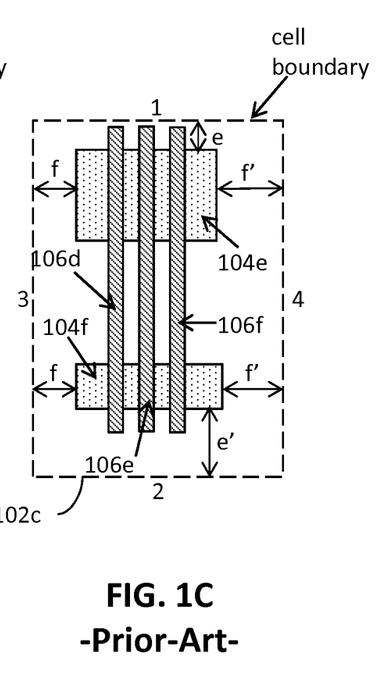

FIGS. 1A-1C are schematic layout diagrams of first through third conventional standard cells 102a-102c (collectively referred to as standard cells 102). The first standard cell 102a may be a logic AND function, the second standard cell 102b a logic OR function, and the third standard cell 102c a logic NOT function.

The first standard cell 102a includes first and second active regions 104a and 104b (collectively referred to as active regions 104) formed over a substrate (not shown). A gate (poly) electrode strip 106a is disposed over the first and second active regions 104a and 104b. The gate electrode strip 106a forms a first MOS device with the first active region 104a and a second MOS device with the second active region 104b. As understood by those of skill in the art, within a standard cell 102, each gate electrode 106 forms a p-type MOS (PMOS) device with one active region 104 and a n-type MOS (NMOS) device with opposing active region 104.

Similarly, the second standard cell 102b includes third and fourth active regions 104c and 104d formed over the substrate and gate electrode strips 106b and 106c disposed over the third and fourth active regions 104c and 104d to form third and fourth MOS devices. The third standard cell 102c also has fifth and sixth active regions 104e and 104f formed over the substrate and gate electrode strips 106d, 106e, and 106f disposed over the fifth and sixth active regions 104e and 104f to form fifth and sixth MOS devices.

Each standard cell 102 has a boundary that extends at a predetermined distance along its outer periphery. The boundary includes first, second, third and fourth boundaries. The first and second boundaries lie at opposite ends of the standard cell 102. The third and fourth boundaries also lie at opposite ends of the standard cell 102. As can be seen, the first through fourth boundaries are akin to the sides of a rectangle. The first active region 104a is at a distance (a) from the first boundary and the second active region 104b is at a distance (a') from the second boundary. The first and second active regions 104a and 104b are at a distance (b) from the third boundary and at a distance (b') from the fourth boundary. The third active region 104c is at a distance (c) from the first boundary and the fourth active region 104d is at a distance (c') from the second boundary. The third and fourth active regions 104c and 104d are at a distance (d) from the third boundary and at a distance (d') from the fourth boundary. The fifth active region 104e is at a distance (e) from the first boundary and the sixth active region 104f is at a distance (e') from the second boundary. The fifth and sixth active regions 104e and 104f are at a distance (f) from the third boundary and at a distance (f') from the fourth boundary.

The region between the gate electrodes 106 and corresponding active regions 104 is filled with a shallow trench isolation (STI) region. When the MOS devices are formed close to each other, the amount of STI required is less and vice-versa. Since the STI introduces compressive stresses, a wider STI increases the performance of a PMOS device and degrades the performance of an NMOS device, while a narrow STI exhibits exactly the opposite effects.

Figure 2A:
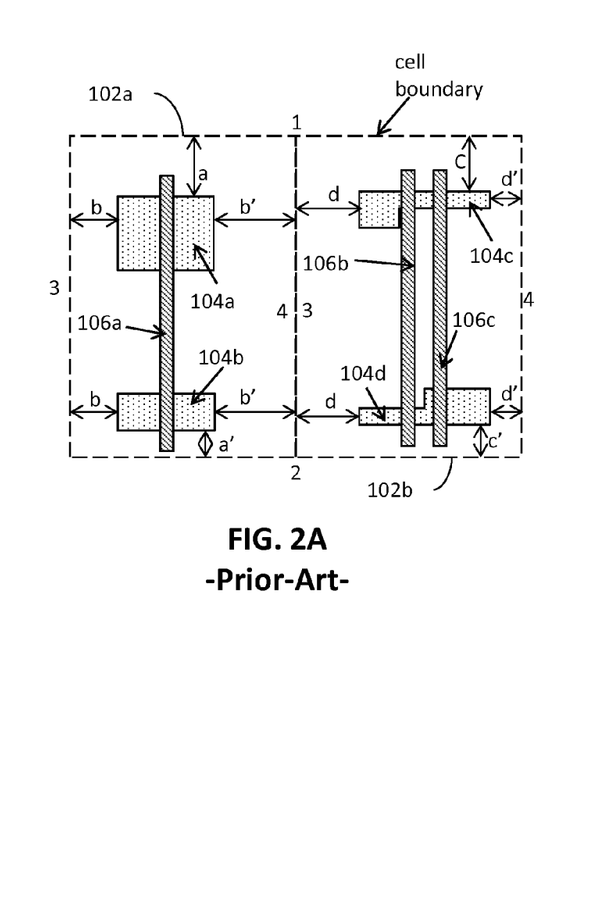
FIGS. 2A and 2B are schematic layout diagrams depicting horizontally and vertically abutted conventional standard cells.
Figure 2B:
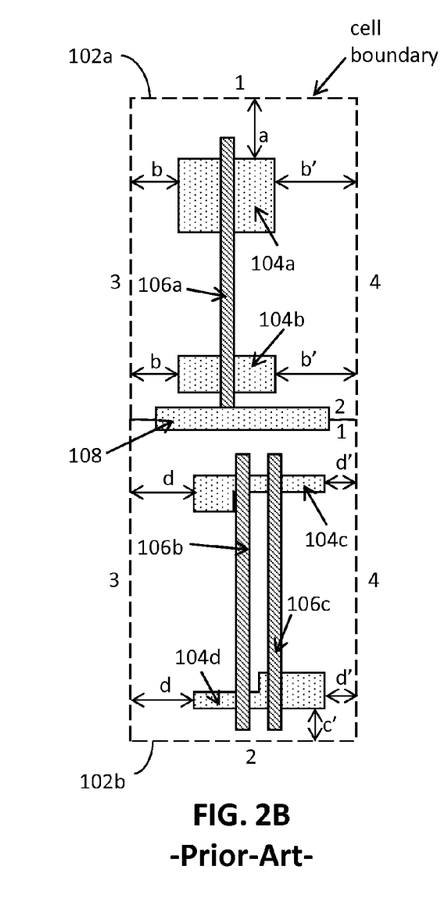

During device design, the design tools place the standard cells 102 in rows and columns to realize the respective logic functions. For example, as shown in FIG. 2A, the first and second standard cells 102a and 102b are abutted horizontally, i.e., the fourth boundary of the first standard cell 102a overlaps with the third boundary of the second standard cell 102b. The distance (b') of the first and second active regions 104a and 104b from the overlapping boundary differs substantially from the distance (d) of the third and fourth active regions 104c and 104d from the overlapping boundary. This difference affects the impact of stresses offered by the varying width of STI, which deteriorates the carrier mobility and saturation current and introduces delay and leakage, thereby degrading the overall performance of the MOS devices. The problem persists when the first and second standard cells 102a and 102b are abutted vertically, i.e., when the second boundary of the first standard cell 102a overlaps with the first boundary of the second standard cell 102b, as shown in FIG. 2B. To avoid the impact of stresses due to vertical abutting, a dummy diffusion layer 108 is formed over the overlapping boundary (as shown in FIG. 2B). However, the dummy diffusion layer 108 increases the area overhead of the standard cell as well as the IC.

In light of the foregoing, there is a need for a standard cell design that reduces variation in stress caused by varying width of STI, that improves carrier mobility and saturation current, reduces delay and leakage, improves overall performance of the standard cell, and that overcomes the above-mentioned limitations of existing standard cells.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF PREFERRED EMBODIMENTS

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a semiconductor device is provided. The semiconductor device includes a rectangular standard cell defined in a semiconductor substrate and having first, second, third, and fourth boundaries. The first and second boundaries are on opposite ends of the standard cell and the third and fourth boundaries are on opposite ends of the standard cell. The standard cell includes a plurality of active regions including first and second active regions formed in the semiconductor substrate. The first and second active regions have a first spacing distance (a) from the first and second boundaries, respectively. At least one gate electrode strip is formed over the first and second active regions. First and second dummy diffusion layers are formed in the semiconductor substrate that extend along the third boundary and have the first spacing distance (a) from the first and second boundaries and a second spacing distance (b) from the first and second active regions, respectively. Similarly third and fourth dummy diffusion layers formed in the semiconductor substrate that extend along the fourth boundary and have the first spacing distance (a) from the first and second boundaries and a third spacing distance (b') from the first and second active regions, respectively.

In another embodiment of the present invention, a semiconductor device is provided. The semiconductor device includes a rectangular standard cell that is defined in a semiconductor substrate and has first, second, third, and fourth boundaries. The first and second boundaries are on opposite ends of the standard cell and the third and fourth boundaries are on opposite ends of the standard cell. The standard cell includes a plurality of pairs of active regions including first and second pairs of active regions formed in the semiconductor substrate. Each pair of active regions includes first and second active regions that have a first spacing distance (a) from the first and second boundaries, respectively. At least one gate electrode strip is formed over each of the first and second pairs of active regions. First and second dummy diffusion layers are formed in the semiconductor substrate that extend along the third boundary and have the first spacing distance (a) from the first and second boundaries, respectively, and a second spacing distance (b) from the first pair of active regions. Third and fourth dummy diffusion layers are formed in the semiconductor substrate that extend along the fourth boundary and have the first spacing distance (a) from the first and second boundaries, respectively, and a third spacing distance (b') from the second pair of active regions.

In yet another embodiment of the present invention, a semiconductor device is provided. The semiconductor device includes first and second rectangular standard cells that are defined in a semiconductor substrate and each having first, second, third, and fourth boundaries. The first and second boundaries are on opposite ends of each of the first and second standard cells and the third and fourth boundaries are on opposite ends of each of the first and second standard cells. The first and second standard cells are abutted such that fourth boundary of the first standard cell overlaps the third boundary of the second standard cell to form an overlapping boundary. The first standard cell includes first and second active regions that are formed in the semiconductor substrate and have a first spacing distance (a) from the first and second boundaries, respectively. A first gate electrode strip is formed over the first and second active regions. First and second dummy diffusion layers formed in the semiconductor substrate that extend along the third boundary and have the first spacing distance (a) from the first and second boundaries and a second spacing distance (b) from the first and second active regions, respectively. Third and fourth dummy diffusion layers are formed in the semiconductor substrate that extend along the overlapping boundary and have the first spacing distance (a) from the first and second boundaries, and a third spacing distance (b') from the first and second active regions, respectively. The second standard cell includes third and fourth active regions that are formed in the semiconductor substrate and have the first spacing distance (a) from the first and second boundaries and a fourth spacing distance (c) from the third and fourth dummy diffusion layers, respectively. A second gate electrode strip is formed over the third and fourth active regions. Fifth and sixth dummy diffusion layers are formed in the semiconductor substrate that extend along the fourth boundary and have the first spacing distance (a) from the first and second boundaries and a fifth spacing distance (c') from the third and fourth active regions, respectively.

Various embodiments of the present invention provide a standard cell for a semiconductor device. The standard cell has first second, third and fourth boundaries of which the first and second boundaries are opposite to each other and the third and fourth boundaries are opposite to each other. The standard cell includes a plurality of active regions including first and second active regions formed over a substrate. At least one gate electrode is formed over the first and second active regions. The first and second active regions are formed at a first predetermined distance from the first and second boundaries. Further, first and second dummy diffusion layers are formed along the third boundary and at the first predetermined distance from the first and second boundaries and at a second predetermined distance from the first and second active regions, respectively. Similarly, third and fourth dummy diffusion layers are formed along the fourth boundary and at the first predetermined distance from the first and second boundaries and at a third predetermined distance from the first and second active regions, respectively. When two such standard cells are abutted vertically (by overlapping the second boundary of a first standard cell with the first boundary of a second standard cell), second and first active regions of the first and second standard cells are equidistant from the overlapping boundary, which reduces the impact of stresses caused by varying width of STI regions (filled between the active regions, gate electrode and dummy diffusion layers) and improves the carrier mobility and saturation current. Delay and leakage of the standard cell is also reduced which improves the overall performance of the standard cell.

When two such standard cells are abutted horizontally (by overlapping the second boundary of a first standard cell with the first boundary of a second standard cell) the dummy diffusion layers over the overlapping boundary reduce the impact of stresses caused by varying distance of the first and second active regions and the third and fourth active regions from the overlapping boundary and further improves the performance of the standard cell.

Figures 3A, 3B, 3C:
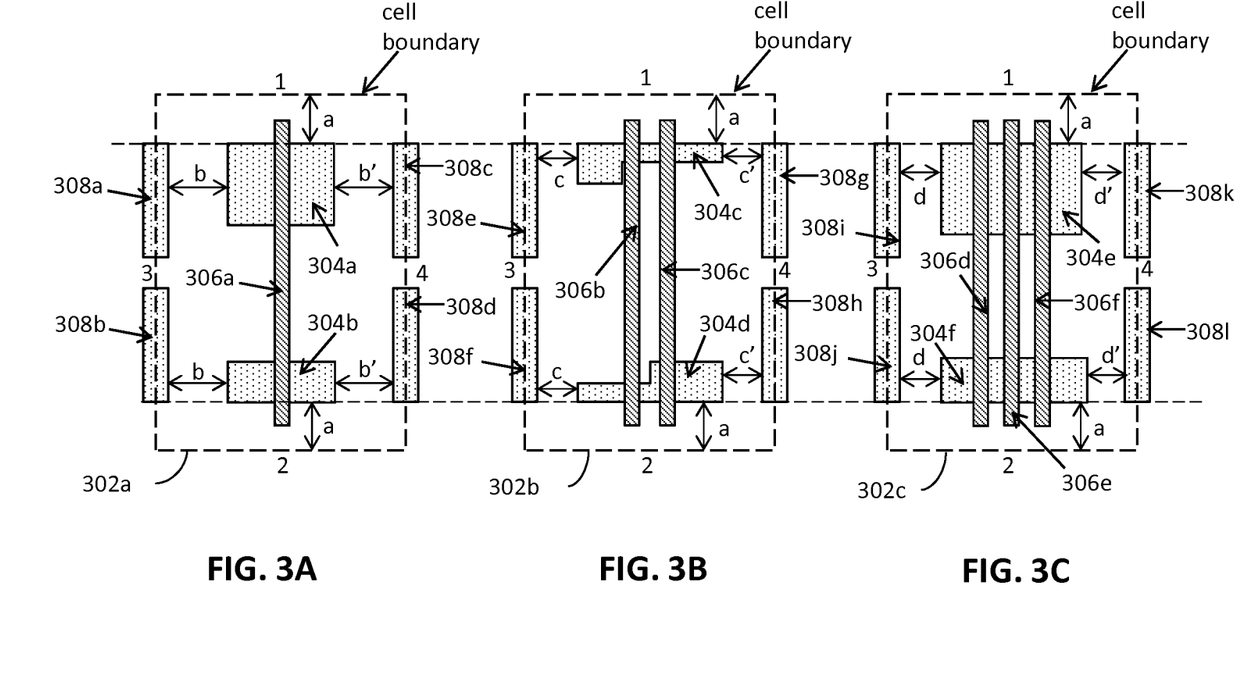
FIGS. 3A, 3B, 3C are schematic layout diagrams of standard cells in accordance with an embodiment of the present invention.

Referring now to FIGS. 3A-3C, schematic layout diagrams of first through third standard cells 302a-302c, in accordance with an embodiment of the present invention, are shown. In various embodiments of the present invention, the first through third standard cells 302a-302c represent logic functions including Boolean functions (e.g., AND, OR, and NOT), storage functions (e.g., flip-flops, latches, and buffers), and digital combinational functions (e.g., multiplexers and demultiplexers). As can be seen in the drawings, the standard cells 302 are generally rectangular in shape and thus, have four sides, labeled 1-4.

The first standard cell 302a includes first and second active regions 304a and 304b formed over a semiconductor substrate (not shown). A gate electrode strip 306a is disposed over the active regions 304a and 304b. The gate electrode strip 306a forms a first MOS device with the first active region 304a and a second MOS device with the second active region 304b. Each gate electrode 306 forms a p-type MOS (PMOS) device with one active region 304 and an n-type MOS (NMOS) device with the opposing active region 304. A pair of PMOS and NMOS devices is referred to as a complementary-MOS (CMOS) transistor and a standard cell may include multiple CMOS transistors. The process of forming the PMOS and NMOS devices is well known to those skilled in the art.

Similarly, the second standard cell 302b includes third and fourth active regions 304c and 304d formed over the substrate. Gate electrode strips 306b and 306c are disposed over the third and fourth active regions 304c and 304d and form third and fourth MOS devices therewith. The third standard cell 302c includes fifth and sixth active regions 304e and 304f formed over the substrate. Gate electrode strips 306d, 306e, and 306f are disposed over the fifth and sixth active regions 304e and 304f and form fifth and sixth MOS devices therewith.

Each standard cell 302 has a boundary that extends at a predetermined distance along its outer periphery. The boundary includes first and second boundaries that lie at opposite ends of the standard cell 302 and third and fourth boundaries that also lie at other opposite ends of the standard cell 302. The first standard cell 302a further includes four dummy diffusion layers 308a-308d of which the dummy diffusion layers 308a and 308b are disposed along the third boundary and the dummy diffusion layers 308c and 308d are disposed along the fourth boundary. Similarly, the second standard cell 302b includes four dummy diffusion layers 308e-308h of which the dummy diffusion layers 308e and 308f are disposed along the third boundary and the dummy diffusion layers 308g and 308h are disposed along the fourth boundary. The third standard cell 302c includes four dummy diffusion layers 308i-308l of which the dummy diffusion layers 308i and 308j are disposed along the third boundary and the dummy diffusion layers 308k and 308l are disposed along the fourth boundary. In various embodiments of the present invention, the dummy diffusion layers 308 have a width that is symmetrical about the boundary over which they are disposed.

For the first standard cell 302a, the dummy diffusion layers 308a and 308c are at a distance (a) from the first boundary and the dummy diffusion layers 308b and 308d are at a distance (a) from the second boundary. The first and second active regions 304a and 304b are at a distance (a) from the first and second boundaries, respectively. The first and second active regions 304a and 304b are at a distance (b) from the dummy diffusion layers 308a and 308b and at a distance (b') from the dummy diffusion layers 308c and 308d, respectively. For the second standard cell 302b, the dummy diffusion layers 308e and 308g are at a distance (a) from the first boundary and the dummy diffusion layers 308f and 308h are at a distance (a) from the second boundary. The third and fourth active regions 304c and 304d are at a distance (a) from the first and second boundaries, respectively, at a distance (c) from the dummy diffusion layers 308e and 308f, and at a distance (c') from the dummy diffusion layers 308g and 308h, respectively. For the third standard cell 302c, the dummy diffusion layers 308i and 308k are at a distance (a) from the first boundary and the dummy diffusion layers 308j and 308l are at a distance (a) from the second boundary. The fifth and sixth active regions 304e and 304f are at a distance (a) from the first and second boundaries, respectively, at a distance (d) the dummy diffusion layers 308i and 308j, and at a distance (d') from the dummy diffusion layers 308k and 308l.

The region between the active regions 304, corresponding gate electrodes 306, and dummy diffusion layers 308 is filled with shallow trench isolation (STI) region. The process of filling the STI is well known in the art.

Figure 4A:
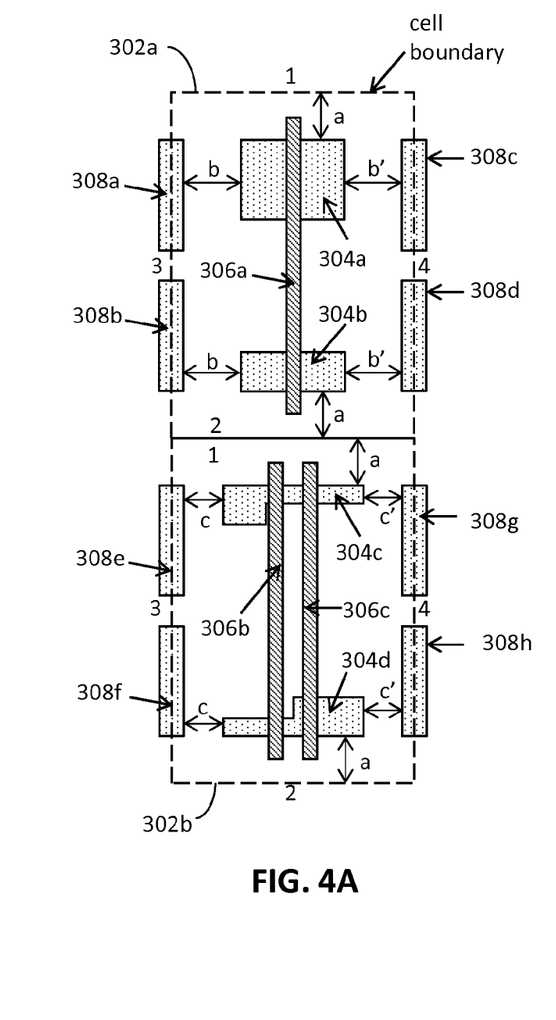
FIGS. 4A and 4B are schematic layout diagrams depicting horizontally and vertically abutted standard cells in accordance with an embodiment of the present invention.

During semiconductor device design, multiple standard cells 302 are abutted vertically and horizontally to form columns and rows to realize a circuit design. FIG. 4A shows vertical abutting of the first and second standard cells 302a and 302b, i.e., the second boundary of the first standard cell 302a overlaps with the first boundary of the second standard cell 302b. In this case, the second and third active regions 304b and 304c are equidistant (a) from the overlapping boundary, which reduces the impact of stresses (along the vertical direction) caused by the varying width of STI and improves the carrier mobility and saturation current and reduces delay and leakage of the standard cell 302, thereby improving the overall performance of the standard cell 302.

Figure 4B:
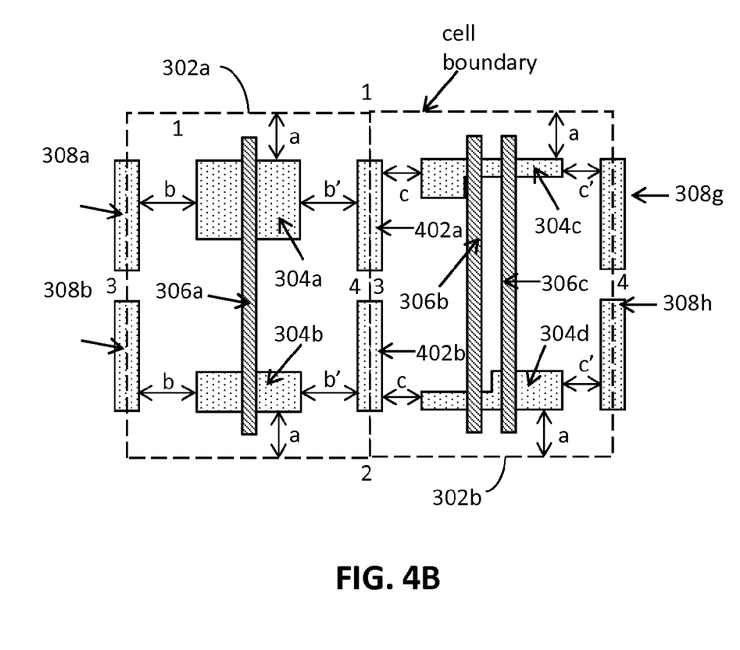
Figure 5:
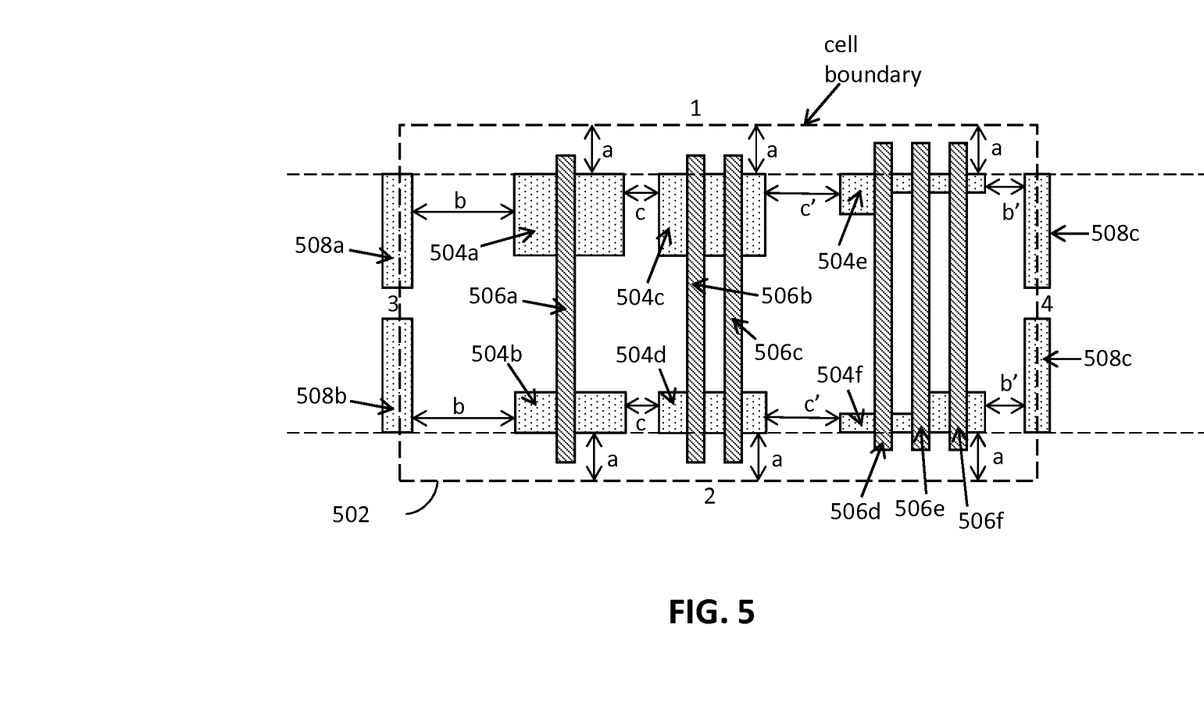
FIG. 5 is a schematic layout diagram of a multi-transistor standard cell in accordance with an embodiment of the present invention.

Horizontal abutting of the first and second standard cells 302a and 302b is shown in FIG. 4B in which the fourth boundary of the first standard cell 302a overlaps with the third boundary of the second standard cell 302b. For horizontal abutting, two dummy diffusion layers (402a and 402b, as shown in FIG. 5) are disposed along the overlapping boundary and have a similar arrangement as that of the dummy diffusion layers 308c and 308d or 308e and 308f. The dummy diffusion layers 402a and 402b further reduce the impact of stresses (along the horizontal direction) caused by the varying distance that the first and second active regions 104a and 104b and the third and fourth active regions 104c and 104d have from the overlapping boundary and further improves the overall performance of the MOS devices.

FIG. 5 is a schematic layout diagram of a multi-transistor standard cell 502, in accordance with an alternate embodiment of the present invention. The standard cell 502 includes first through sixth active regions 504a-504f formed over a semiconductor substrate (not shown). A gate electrode strip 506a disposed over the first and second active regions 504a and 504b forms the first pair of PMOS and NMOS devices, i.e., the first CMOS transistor. Gate electrode strips 506b and 506c disposed over the second and third active regions 504c and 504d form the second pair of PMOS and NMOS devices, i.e., the second CMOS transistor. Gate electrode strips 506d-506f disposed over the fourth and fifth active regions 504e and 504f form the third pair of PMOS and NMOS devices, i.e., the third CMOS transistor. The standard cell 502 further includes four dummy diffusion layers 508a-508d of which the dummy diffusion layers 508a and 508b are disposed along the third boundary and the dummy diffusion layers 508c and 508d are disposed along the fourth boundary. The dummy diffusion layers 508a and 508c are at a distance (a) from the first boundary and the dummy diffusion layers 508b and 508d are at a distance (a) from the second boundary. The first, third and fifth active regions 504a, 504c, and 504e are at a distance (a) from the first boundary and the second, fourth, and sixth active regions 504b, 504d, and 504f are at a distance (a) from the second boundary. The first and second active regions 504a and 504b are at a distance (b) from the dummy diffusion layers 508a and 508b and the fifth and sixth active regions 504e and 504f are at a distance (b') from the dummy diffusion layers 508c and 508d. The third and fourth active regions 504c and 504d are at a distance (c) from the first and second active regions 504a and 504b, and at a distance (c') from the fifth and sixth active regions 504e and 504f, respectively. It will be apparent to those skilled in art that the standard cell 502 may include more than three CMOS transistors.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It should be understood that, although the terms first, second, etc. and horizontal and vertical are used to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A semiconductor device, comprising:
   a rectangular standard cell defined in a semiconductor substrate and having first, second, third, and fourth boundaries, wherein the first and second boundaries are on opposite ends of the standard cell, and wherein the third and fourth boundaries are on opposite ends of the standard cell, the standard cell comprising:
   a plurality of active regions including first and second active regions formed in the semiconductor substrate, and having a first spacing distance (a) from the first and second boundaries, respectively;
   at least one gate electrode strip formed over the first and second active regions;
   first and second dummy diffusion layers formed in the semiconductor substrate, wherein the first and second dummy diffusion layers extend along the third boundary and have the first spacing distance (a) from the first and second boundaries and a second spacing distance (b) from the first and second active regions, respectively; and
   third and fourth dummy diffusion layers formed in the semiconductor substrate, wherein the third and fourth dummy diffusion layers extend along the fourth boundary and have the first spacing distance (a) from the first and second boundaries and a third spacing distance (b') from the first and second active regions, respectively.

2. The semiconductor device of claim 1, further comprising a shallow trench isolation (STI) region filled between the first active region and the first and third dummy diffusion layers, and between the second active region and the second and fourth dummy diffusion layers.

3. The semiconductor device of claim 1, wherein the first and second dummy diffusion layers have a width that is symmetrical about the third boundary.

4. The semiconductor device of claim 1, wherein the third and fourth dummy diffusion layers have a width that is symmetrical about the fourth boundary.

5. The semiconductor device of claim 1, wherein the first and second active regions have opposite conductivities.

6. The semiconductor device of claim 5, wherein the at least one gate electrode strip and the first active region form a first metal oxide semiconductor (MOS) device and the at least one gate electrode strip and the second active region form a second MOS device.

7. The semiconductor device of claim 6, wherein the first and second MOS devices each include at least one of a p-type MOS (PMOS) device and a n-type MOS (NMOS) device.

8. A semiconductor device, comprising:
   a rectangular standard cell defined in a semiconductor substrate and having first, second, third, and fourth boundaries, wherein the first and second boundaries are on opposite ends of the standard cell, and the third and fourth boundaries are on opposite ends of the standard cell, the standard cell comprising:
   a plurality of pairs of active regions including first and second pairs of active regions formed in the semiconductor substrate, wherein each pair of active regions includes first and second active regions having a first spacing distance (a) from the first and second boundaries, respectively;
   at least one gate electrode strip formed over each of the first and second pairs of active regions;
   first and second dummy diffusion layers formed in the semiconductor substrate, wherein the first and second dummy diffusion layers extend along the third boundary and have the first spacing distance (a) from the first and second boundaries, respectively, and a second spacing distance (b) from the first pair of active regions; and
   third and fourth dummy diffusion layers formed in the semiconductor substrate, wherein the third and fourth dummy diffusion layers extend along the fourth boundary and have the first spacing distance (a) from the first and second boundaries, respectively, and a third spacing distance (b') from the second pair of active regions.

9. The semiconductor device of claim 8, further comprising a shallow trench isolation (STI) region filled between the first pair of active regions and the first and third dummy diffusion layers, and between the second pair of active regions and the second and fourth dummy diffusion layers.

10. The semiconductor device of claim 8, wherein the first and second dummy diffusion layers have a width that is symmetrical about the third boundary.

11. The semiconductor device of claim 8, wherein the third and fourth dummy diffusion layers have a width that is symmetrical about the fourth boundary.

12. The semiconductor device of claim 8, wherein the first and second active regions have opposite conductivities.

13. The semiconductor device of claim 12, wherein the at least one gate electrode strip and the first active region form a first metal oxide semiconductor (MOS) device and the at least one gate electrode strip and the second active region form a second MOS device.

14. The semiconductor device of claim 13, wherein the first and second MOS devices each include at least one of a p-type MOS (PMOS) device and a n-type MOS (NMOS) device.

15. A semiconductor device, comprising:
first and second rectangular standard cells defined in a semiconductor substrate and each having first, second, third, and fourth boundaries, wherein the first and second boundaries are on opposite ends of each of the first and second standard cells, and wherein the third and fourth boundaries are on opposite ends of each of the first and second standard cells, and wherein the first and second standard cells are abutted such that fourth boundary of the first standard cell overlaps the third boundary of the second standard cell to form an overlapping boundary, and wherein the first standard cell comprises:
first and second active regions formed in the semiconductor substrate and having a first spacing distance (a) from the first and second boundaries, respectively;
a first gate electrode strip formed over the first and second active regions;
first and second dummy diffusion layers formed in the semiconductor substrate, wherein the first and second dummy diffusion layers extend along the third boundary and have the first spacing distance (a) from the first and second boundaries and a second spacing distance (b) from the first and second active regions, respectively; and
third and fourth dummy diffusion layers formed in the semiconductor substrate, wherein the third and fourth dummy diffusion layers extend along the overlapping boundary and have the first spacing distance (a) from the first and second boundaries, and a third spacing distance (b') from the first and second active regions, respectively,
and wherein the second standard cell comprises:
third and fourth active regions formed in the semiconductor substrate and having the first spacing distance (a) from the first and second boundaries and a fourth spacing distance (c) from the third and fourth dummy diffusion layers, respectively;
a second gate electrode strip formed over the third and fourth active regions; and
fifth and sixth dummy diffusion layers formed in the semiconductor substrate, wherein the fifth and sixth dummy diffusion layers extend along the fourth boundary and have the first spacing distance (a) from the first and second boundaries and a fifth spacing distance (c') from the third and fourth active regions.

16. The semiconductor device of claim 15, further comprising a shallow trench isolation (STI) region filled between the first active region and the first and third dummy diffusion layers, the second active region and the second and fourth dummy diffusion layers, the third active region and the third and fifth dummy diffusion layers, and the fourth active region and the fourth and sixth dummy diffusion layers.

17. The semiconductor device of claim 15, wherein the first and second active regions and the third and fourth active regions each have opposite conductivities.

18. The semiconductor device of claim 17, wherein the first gate electrode strip and the first and second active regions form first and second metal oxide semiconductor (MOS) devices and the second gate electrode strip and the third and fourth active regions form third and fourth MOS devices.

19. The semiconductor device of claim 18, wherein the first, second, third and fourth MOS devices each include at least one of a p-type MOS (PMOS) device and a n-type MOS (NMOS) device.

* * * * *